United States Patent [19]

Tsuji

[11] Patent Number: 5,491,352
[45] Date of Patent: Feb. 13, 1996

[54] SEMICONDUCTOR DEVICE HAVING PERIPHERAL METAL WIRING

[75] Inventor: Nobuaki H. Tsuji, Hamamatsu, Japan

[73] Assignee: Yamaha Corporation, Hamamatsu, Japan

[21] Appl. No.: 319,140

[22] Filed: Oct. 6, 1994

Related U.S. Application Data

[62] Division of Ser. No. 910,624, Jul. 8, 1992, Pat. No. 5,391,920.

[30] Foreign Application Priority Data

| Jul. 9, 1991 | [JP] | Japan | 3-168508 |
| Sep. 11, 1991 | [JP] | Japan | 3-232016 |

[51] Int. Cl.$^6$ ............ H01L 23/485; H01L 29/40
[52] U.S. Cl. ............ 257/207; 257/211; 257/758; 257/920
[58] Field of Search ............ 257/203, 207, 257/211, 758, 773, 776, 629, 734, 775, 920

[56] References Cited

U.S. PATENT DOCUMENTS

| 4,914,503 | 4/1990 | Shirato et al. | 257/758 |
| 5,117,280 | 5/1992 | Adachi | 257/669 |
| 5,287,002 | 2/1994 | Freeman, Jr. et al. | 257/781 |

FOREIGN PATENT DOCUMENTS

| 0407933 | 1/1991 | European Pat. Off. | 257/207 |
| 0198772 | 10/1985 | Japan | 257/207 |
| 0193264 | 8/1987 | Japan . | |
| 0175447 | 7/1988 | Japan | 257/207 |
| 0272135 | 10/1989 | Japan | 257/207 |
| 0192156 | 7/1990 | Japan | 257/207 |

*Primary Examiner*—William Mintel
*Assistant Examiner*—Peter Toby Brown
*Attorney, Agent, or Firm*—Loeb and Loeb

[57] ABSTRACT

At a peripheral area of a semiconductor chip where active elements are not formed, a layer underlying a power supply wiring or ground wiring is provided with an uneven surface. The uneven or corrugated surface at the interface between the wiring and the underlying layer makes the wiring unsusceptible to slide. The uneven surface can be realized by interposing foreign matters between insulating layers, by selectively reducing the thickness of an insulating layer, or by forming openings in an insulating layer.

18 Claims, 9 Drawing Sheets

SEMICONDUCTOR DEVICE HAVING PERIPHERAL METAL WIRING

This is a divisional of application Ser. No. 07/910,624, filed Jul. 8, 1992, now U.S. Pat. No. 5,391,920.

BACKGROUND OF THE INVENTION a) Field of the Invention

The present invention relates to a semiconductor device, and more particularly to a semiconductor device having a metal wiring at the peripheral area of the chip.

b) Description of the Related Art

An example of a conventional semiconductor device will be described with reference to FIGS. 10 and 11.

FIG. 10 is a plan view showing the structure of a corner area of a semiconductor device (semiconductor chip). As shown in FIG. 10, a silicon chip 1 has a wide metal wiring 2 formed on the upper surface of the chip 1 at its peripheral area. The metal wiring 2 is made of aluminum or the like, and is bent at the corner by about 90 degrees. Such a wide metal wiring 2 is generally used as a power source line or a common (ground) line. FIG. 11 is a cross sectional view taken along line A—A' of FIG. 10. As shown in FIG. 11, on the upper surface of a silicon substrate 3 there are formed silicon oxide films 4 and 5, and the above-described metal wiring 2 being formed on the silicon oxide film 5. A passivation film 8 formed of polyimide, silicon nitride or the like covers the metal wiring 2 and oxide film 5.

Thermal stresses are applied from sealing resin to underlying layers of a semiconductor device. Thermal stresses are generated depending upon external environments, heat dissipation by power-on, or the like. Specifically, stresses are generated in accordance with differences of thermal expansion and contraction characteristics among a semiconductor substrate, oxide films, wiring layers, sealing resin and the like. Stresses are applied in the directions indicated by arrows in FIGS. 10 and 11, and concentrated on a corner area. With larger stresses at the corner area, the metal wiring 2 slides toward the inside of the chip in some cases. Such a phenomenon is conspicuous at the corner area, although it is not limited only at the corner area. Cracks may occur in a passivation film depending upon the magnitude of stress.

To solve the above problems, the following approaches have been made conventionally:

(a) forming no metal wiring at a chip corner area as shown in FIG. 12A;

(b) forming narrow parallel metal wirings 2a, 2b, 2c in place of a wide metal wiring to disperse and reduce stresses as shown in FIG. 12B; and (c) forming some narrow slits 9a, 9b in a wide metal wiring 2 in the longitudinal direction thereof to disperse and reduce stresses as shown in FIG. 12C.

However, the approach (a) requires an empty space at the chip corner, lowering a usage factor of the chip surface. The approach (b) has some advantageous effect and is presently used, but it is not satisfactory in that metal wiring slide cannot be completely eliminated. The approach (c) generates a local current concentration, degrading the performance of devices.

SUMMARY OF THE INVENTION

It is an object of the present invention to provide a semiconductor device capable of eliminating metal wiring slide.

It is another object of the present invention to provide a semiconductor device capable of reliably eliminating metal wiring slide, without forming any empty space and local current concentration.

According to one aspect of the present invention, there is provided a semiconductor device including: a semiconductor chip having a central area with semiconductor elements and a peripheral corner area without semiconductor elements; an insulating film structure formed on the surface of the semiconductor chip, the insulating film structure having an uneven surface at the peripheral corner area; a metal wiring pattern formed on an uneven surface of the insulating film structure at the peripheral corner area; and a passivation film covering the metal wiring pattern on the insulating film structure.

A metal wiring is formed on an uneven surface of the underlying layer. Therefore, stresses applied to the metal wiring include stresses not only in the direction parallel to the interface between the metal wiring and the underlying layer, but also in various different directions. As a result, even if stresses are applied to the metal wiring, it is unsusceptible to slides.

DESCRIPTION OF THE PREFERRED EMBODIMENTS

Figure 13:
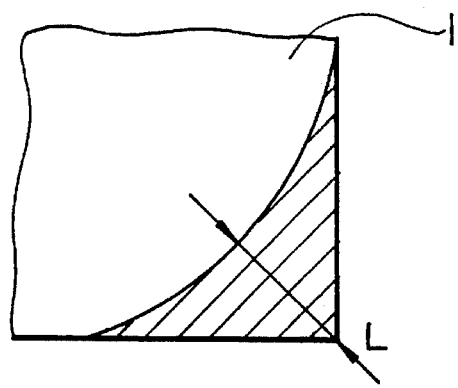
FIG. 13 is a diagram showing a metal slide occurrent area.

The present inventors have studied how metal slide occurs. Metal slide is apt to occur at the peripheral area of a semiconductor chip. Occurrence of metal slides was tested by forming metal wirings having different widths on peripheral areas of chips. The test results indicate that a metal slide occurs at a corner area of a semiconductor chip 1, this area being shown hatched in FIG. 13.

Figure 14:
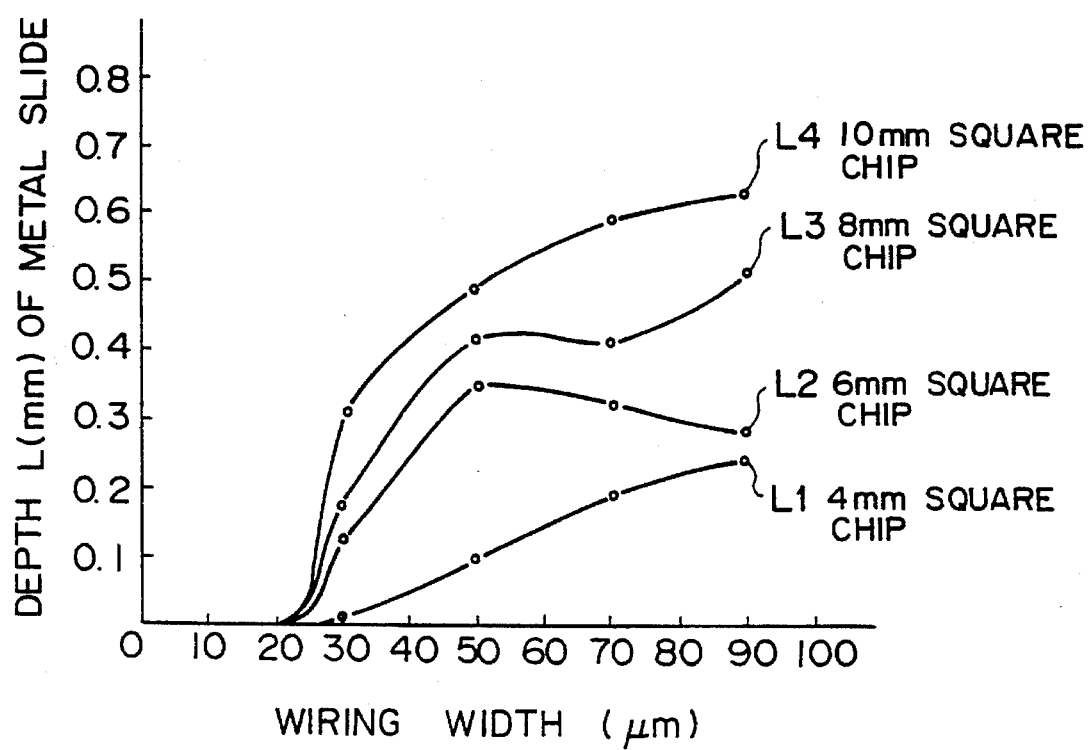
FIG. 14 is a graph showing the relationships between widths of metal wirings and their slide area depths.

FIG. 14 is a graph showing the relationships between widths of metal wirings and their slide area depths. As indicated by a hatched portion of FIG. 13, the metal wiring slide area depth is defined by a distance L from a chip corner point to a point on the diagonal at the inside periphery of the slide area. A longer distance L means a wider slide area where a metal wiring slide is likely to occur. As seen from FIG. 14, the wider the width of a metal wiring, the longer the metal slide area depth L becomes, and so a metal wiring slide becomes likely to occur at a chip corner area. Also, as shown by curves L1 to L4, the depth L of the metal slide area becomes large as the chip size becomes large. A problem of metal wiring slide becomes significant if the wiring width is 30 µm or more.

Embodiments of the present invention will be described with reference to the accompanying drawings.

Figure 1:
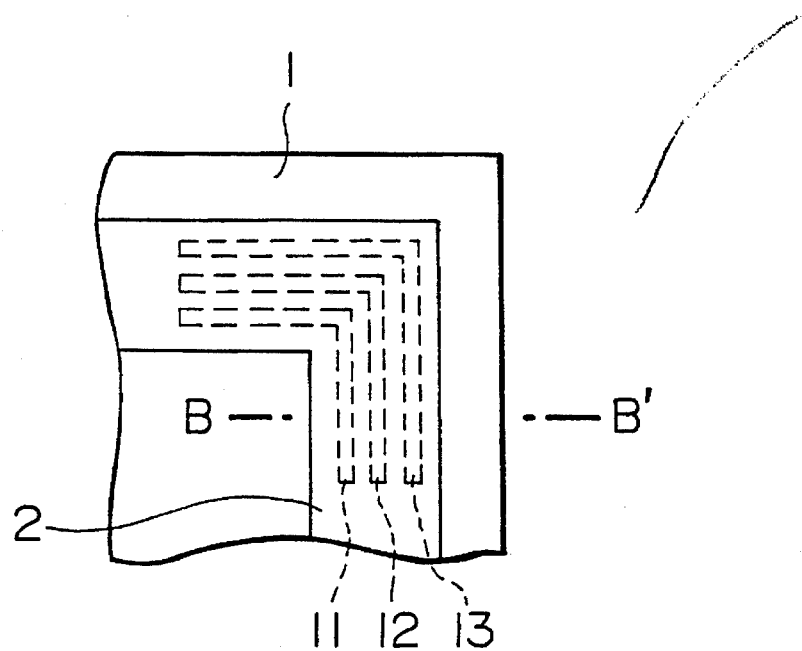
FIG. 1 is a plan view showing the structure of a semiconductor device according to a first embodiment of the present invention.
Figure 2:
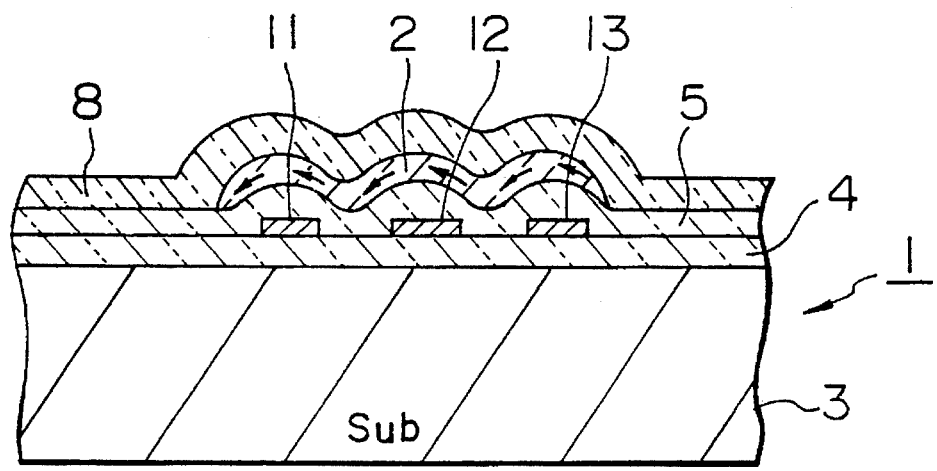
FIG. 2 is a cross section taken along line B—B' of FIG. 1.

FIG. 1 is a plan view showing the structure of a semiconductor device according to the first embodiment of the present invention, and FIG. 2 is a cross section taken along line B—B' of FIG. 1.

As shown in FIG. 1, a silicon chip 1 has a wide metal wiring 2 such as aluminum, aluminum alloy, copper, copper alloy or the like formed on the upper surface of the chip 1 at its peripheral area. This wide metal wiring 2 is used as a power source line or a ground line. As shown in FIG. 2, an $SiO_2$ layer 4 is formed on the surface of the chip 1. In FIG. 1, areas 11, 12 and 13 indicated by broken lines are narrow stripe areas formed at an area under a bending area of the metal wiring 2. The stripe areas 11, 12 and 13 are disposed in parallel with each other, and laminated upon the oxide film 4 as shown in FIG. 2. The stripe areas 11, 12 and 13 are made of polysilicon (polySi), aluminum, or insulating film, and may be formed by the same process as that of forming gate electrodes or the like of a MOS semiconductor device at the central area of the chip 1. Another insulating layer 5 such as $SiO_2$ is formed on these stripe areas, the metal wiring 2 and passivation film 8 being formed on the layer 5.

The provision of the stripe areas 11, 12 and 13 causes the oxide film 5, metal wiring 2 and passivation film 8 respectively formed above the stripe areas to corrugate as shown in FIG. 2. Stresses applied in the lateral direction to the corrugated metal wiring 2 are dispersed in corrugated directions. Namely, generated stress vectors have upward and downward directions, reducing the stress components in the horizontal direction. Reduced stress components in the horizontal direction make the metal wiring 2 and passivation film 8 unsusceptible to slide and cracks, respectively.

Figure 3A:
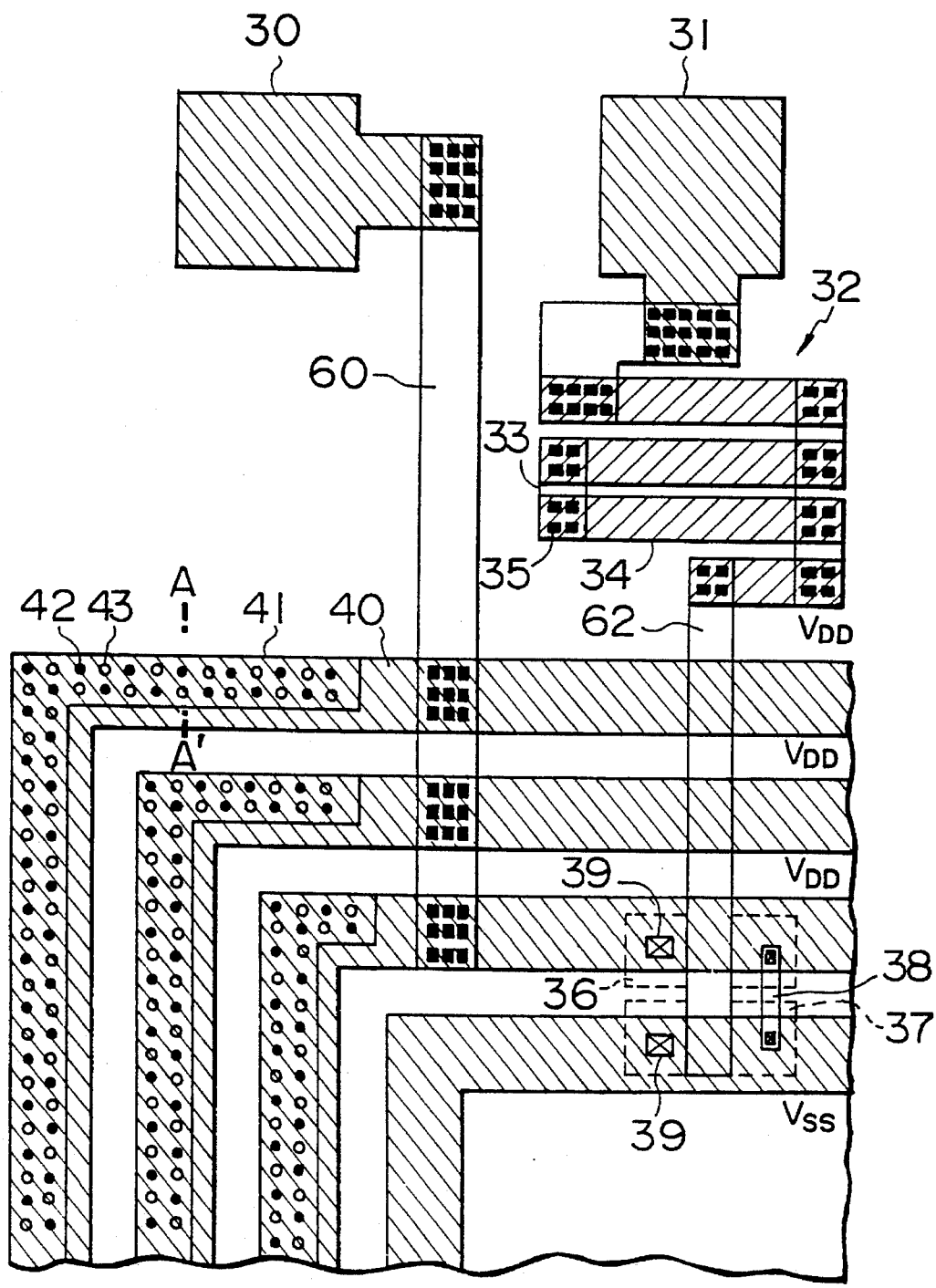
FIG. 3A and 3B are a plan view and a cross section of part of a semiconductor chip.

FIG. 3A shows part of a circuit layout of a semiconductor device to which this invention is applied. The whole circuit is covered with a passivation film not shown in the figure, except pads 30 and 31 where source voltages are applied or signal is inputted.

Voltage lines on the semiconductor chip include lines of $V_{DD}$ and $V_{SS}$ and are disposed mainly in the peripheral portion of the chip. A signal inputted from the pad 31 formed by an upper level metal layer (2M) is inputted to a CMOS circuit 36 and 37, through an input protection circuit 32 provided for avoiding electrostatic breakdown and a metal wiring layer 62 formed of a lower level metal layer (1M). The CMOS circuit is supplied with source voltages $V_{SS}$ and $V_{DD}$ through apertures 39 and performs ON-OFF operation according to the signal applied to the gates. MOSFETs 36 and 37 have source and drain regions (not shown) and are connected to each other by an interconnection 38 to constitute a CMOS circuit.

Here, the input protection circuit 32 has a folded zigzag shape which is formed by lower level metal layers (1M) 33 and polycrystalline silicon layers 34 formed in the upper level as resistors. The metal layers are polycrystalline layers are connected through contact portions 35 formed through a silicon oxide layer. Solid rectangular portions in FIG. 3A represent such interconnection portions between 1M and 2M.

There may be provided no uneven or corrugating portions in the polycrystalline silicon layers in the input protection circuit 32 other than square contact portion, because there occurs no slide in the polycrystalline silicon layers. The reason of no sliding in the polycrystalline silicon layer may be due to the approximate equality between the thermal expansion coefficients of the polycrystalline silicon and silicon oxide.

The pad 30 formed of an upper metal layer 2M is connected to $V_{DD}$ lines through a metal wiring 60 of the lower metal layer 1M. The $V_{DD}$ line is formed of the lower metal layer 41 connected to active regions formed in the silicon substrate by doping, and an upper metal layer 40 deposited thereon. Here, the upper metal layer 40 has a larger width than that of the lower metal layer 41. In the circuit layout of FIG. 3A, the lower wiring layer 41 and the active region are connected through a plurality of contact portions 43 shown by hollow circles in the figure. For preventing sliding of the power source lines, contact portions 43 which are to be projections for resistance to stress are formed along the wiring 40 and 41 over a span longer than the widths of the lower wiring layer 41 and the upper wiring layer 40 with a predetermined interval. Similarly, a plurality of contact portions 42 between the upper metal layer 40 and the lower metal layer 41 are formed along the wiring 40 and 41 over a span longer than the widths of the upper metal layer 40 and the lower metal layer 41. In the present embodiment, the contact portions 42 and the contact portions 43 are provided alternately when seen from the above.

Figure 3B:
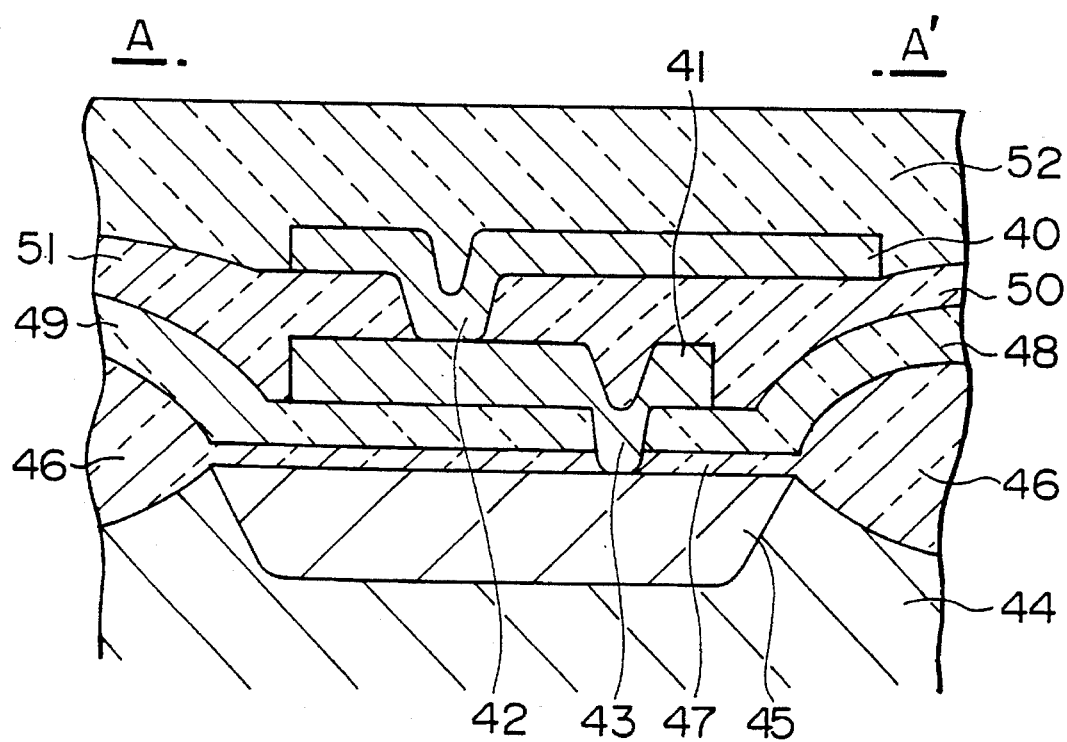

FIG. 3B is a cross section of the semiconductor chip of FIG. 3A along the line A—A'. The structure shown in FIG. 3B can be formed by a well-known conventional technique.

The wiring has a two-layer structure formed of the upper metal layer 40 and the lower metal layer 41. A thin oxide layer 47 is formed on the surface of silicon substrate 44 between thick silicon oxide LOCOS regions 46. The lower metal layer 41 contacts an active region 45 formed in the silicon substrate 44 at a contact portion 43 through an aperture formed in the thin oxide film 47. An interlayer insulating film 48 and 49 is disposed between the active region 45 (and the thin oxide layer 47) and the lower metal layer 41. The upper metal layer 40 and the lower metal layer 41 contact to each other at a contact portion 42. In the area except the contact portion 42, an interlayer insulating film 50 and 51 is disposed between the metal layers 40 and 41 for establishing insulation. A silicon nitride layer 52 is deposited by a well-known conventional techniques, on the upper metal layer 40.

Figure 4:
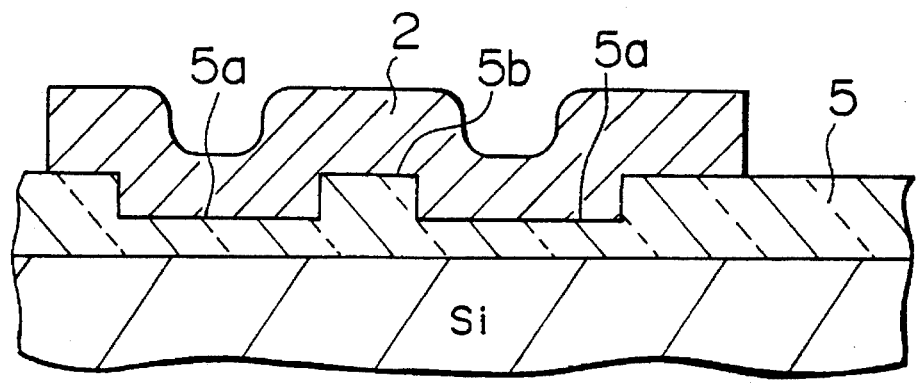
FIG. 4 is a cross section showing the structure of a semiconductor device according to a second embodiment of the present invention.

FIG. 4 is a cross section showing the structure of a semiconductor device according to the second embodiment of the present invention. The different point of this embodiment from the first embodiment resides in that instead of stripe areas, recesses 5a and protrusions 5b are formed on an insulating film 5 such as silicon oxide. The recesses 5a and protrusions 5b are disposed alternately as shown in FIG. 4, and formed at an area under a bending area of the metal wiring 2, like the above-described stripe areas 11, 12 and 13.

Such recesses may be formed, for example, by selectively etching the insulating layer 5. If the insulating layer 5 is made of a plurality of laminated layers, it is sufficient if only one or some of the layers is selectively etched. The provision of the recesses 5a and protrusions 5b causes the metal wiring 2 formed above them to corrugate following the uneven surface of the insulating film 5, ensuring advantageous effects similar to the first embodiment.

According to the first and second embodiments described above, an uneven surface of an insulating layer underlying the wide metal wiring causes the latter to corrugate. As a result, stresses applied in the lateral direction to the metal wiring are resisted by the side walls of the protrusions, and dispersed in upward and downward directions, preventing metal wiring slides and passivation film cracks.

Figure 5:
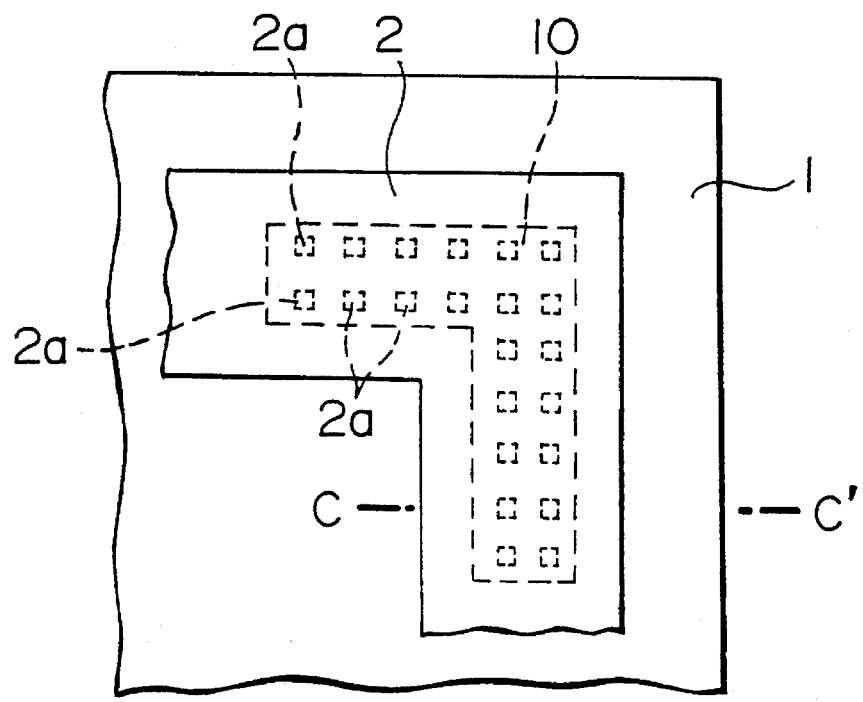
FIG. 5 is a plan view showing the structure of a semiconductor device according to a third embodiment of the present invention.
Figure 6:
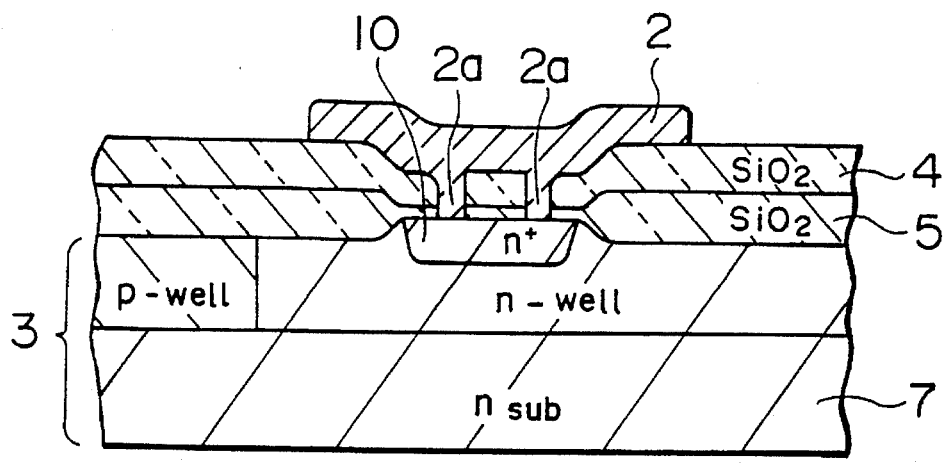
FIG. 6 is a cross section taken along line C—C' of FIG. 5.

FIG. 5 is a plan view showing the structure of a semiconductor device according to the third embodiment of the present invention, and FIG. 6 is a cross section taken along line C—C'. In FIGS. 5 and 6, like elements to those shown in FIGS. 1 and 2 are represented by using like reference numerals, and the description thereof is omitted. In FIGS. 5 and 6, a passivation film is not shown.

In FIG. 5, an 8 mm square chip 1 has a ground metal wiring 2 of 50 µm width formed on the upper surface of the chip 1 at its peripheral area. The distance between a chip corner to a corner of the metal wiring 2 is 0.1 mm. An $n^+$ diffusion layer 10 is formed under an oxide film 5 at an area under a bending area of the metal wiring 10. In this embodiment, a silicon substrate 3 is made of an n-type bulk layer 7 as its bottom layer, and n-well and p-well layers are formed on the bulk layer 7. The $n^+$ diffusion region 10 is electrically connected to the n-type bulk layer 7 to bias the substrate. As shown in FIG. 6, each metal contact 2a extending downward from the metal wiring 2 is connected to the diffusion layer 10 in the form of alloy. Metal contacts 2a are disposed in two rows at a constant pitch at the area under a bending area of the metal wiring 2, as seen from FIG. 5.

Figure 7:
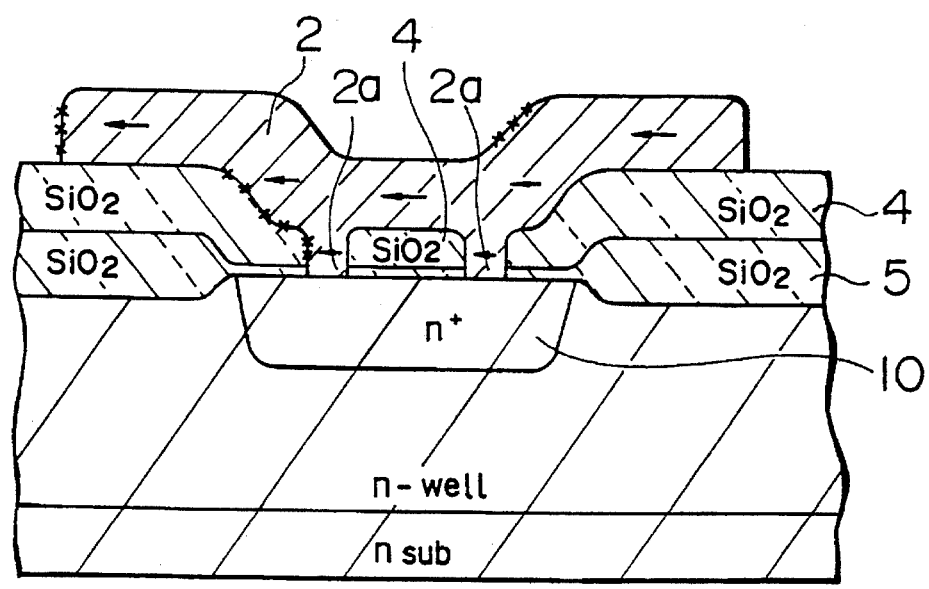
FIG. 7 is an enlarged cross section of FIG. 6.

FIG. 7 is an enlarged view of FIG. 6. With the above-described arrangement, each metal contact 2a extends to the surface of the diffusion layer 10 in the vertical direction, and the metal wiring 2 itself curves downward as shown in FIG. 7. As a result, an area to which stresses in the lateral direction are applied, contains side walls of an insulating film 4, thereby increasing a physical support strength for the metal wiring 2 and dispersing stresses. Furthermore, the metal wiring 2 is fixedly supported to the diffusion layer 10 via metal contacts 2a, so that the metal wiring 2 is prevented from sliding or moving.

In the case of a metal wiring for a power source line, a well region electrically isolated from the substrate bulk region may be formed to connect the metal wiring to the well region.

Figure 8:
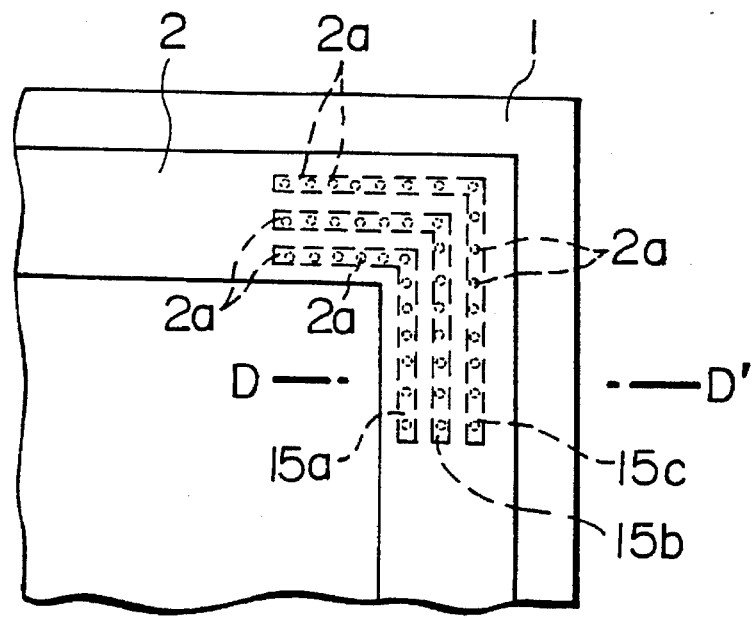
FIG. 8 is a plan view showing the structure of a semiconductor device according to a fourth embodiment of the present invention.

FIG. 8 is a plan view showing the structure of a semiconductor device according to the fourth embodiment of the present invention.

Figure 9:
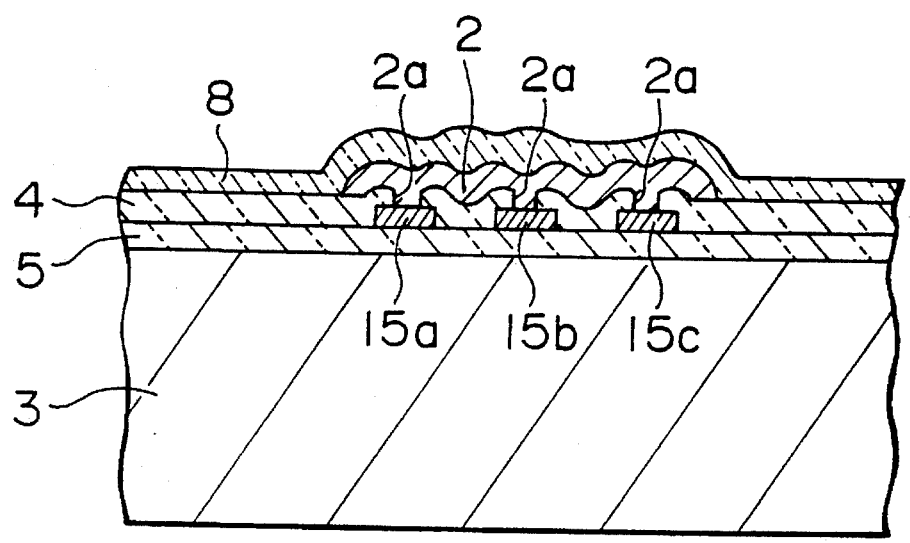
FIG. 9 is a cross section taken along line D—D' of FIG. 8.
Figure 10:
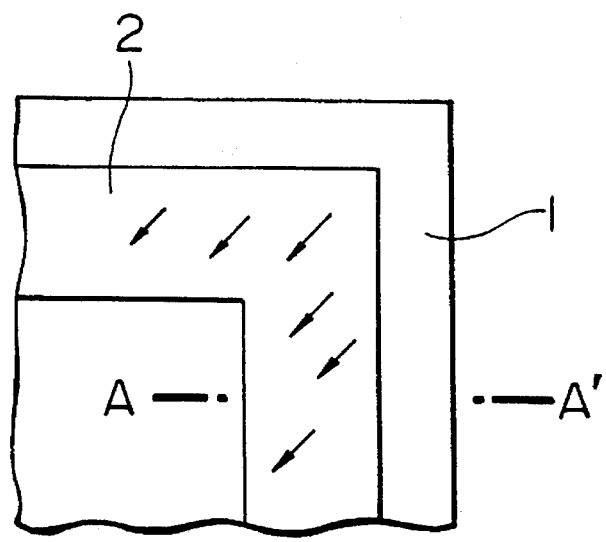
FIG. 10 is a plan view showing the structure of a conventional semiconductor device.
Figure 11:
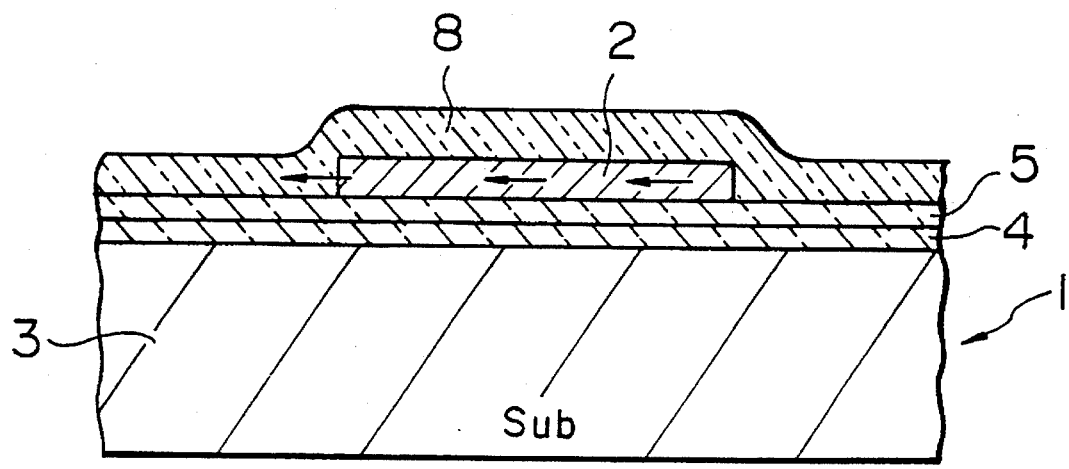
FIG. 11 is a cross section taken along line A—A' of FIG. 10.
Figure 12A:
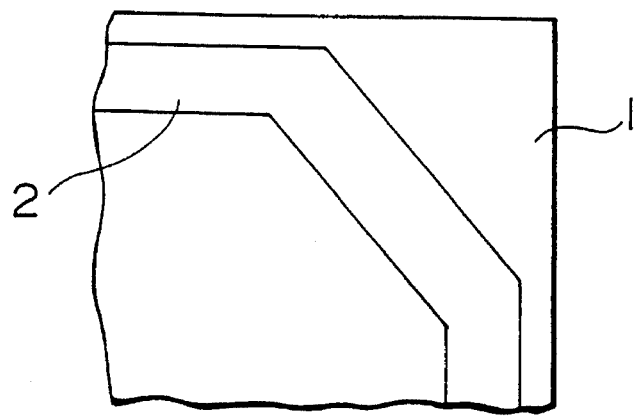
FIGS. 12A to 12C are plan views showing conventional metal wirings.
Figure 12B:
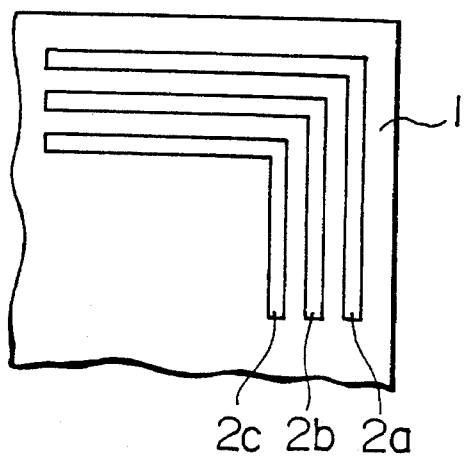
Figure 12C:
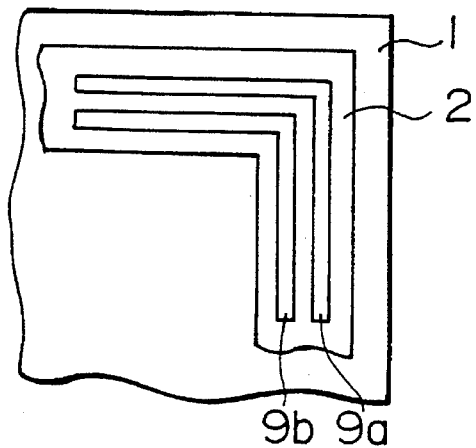

In FIG. 8, a 10 mm square chip 1 has a metal wiring 2 of 90 µm width formed on the upper surface of the chip 1 at its peripheral area. The distance between a chip corner to a corner of the metal wiring 2 is 0.2 mm. Narrow stripe layers 15a, 15b and 15c are formed at an area under a bending area of the metal wiring 2. The stripe layers 15a, 15b and 15c are disposed in parallel with each other, and laminated upon an oxide film 5 as shown in FIG. 9 which is a cross section taken along line D—D' of FIG. 8. The stripe layers 15a, 15b and 15c are formed by the same process as that of forming gate electrodes of MOS transistors at the central area of the chip 1, and are made of gate electrode material such as polysilicon (polySi), polycide and silicide.

As shown in FIG. 8, metal contacts 2a extend from the metal wiring 2 to the stripe layers 15a, 15b and 15c. Metal contacts 2a are disposed at a predetermined pitch in the longitudinal direction of each stripe layer 15a, 15b, 15c, as shown in FIG. 8.

With the arrangement of this embodiment described above, the metal contacts 2a extend to the stripe layers 15a, 15b and 15c in the vertical direction, and the metal wiring 2 itself curves downward and corrugates as shown in FIG. 9. Therefore, stresses are dispersed in the manner similar to the third embodiment. Furthermore, the metal wiring 2 is fixedly supported by the stripe layers 15a, 15b and 15c, thereby preventing the metal wiring from moving.

In the embodiments described above, a one-layer metal wiring has been described. If a two-layer metal wiring is used with the upper metal layer being wider, metal contacts 2a may be extended from the upper metal layer to the lower metal layer. In this case, as the material of the lower metal layer, aluminum or aluminum alloy may be used. When a lower metal layer is a wide metal layer, an upper metal layer may be extended to reach the lower metal layer.

The wider metal layer may be connected to the silicon substrate.

The width of a wide metal wiring is not limited to those described in the embodiments, but the present invention is applicable to metal wiring having any width. The present invention is particularly effective when applied to semiconductor devices having a metal wiring of 30 µm width or more.

As described so far, in the embodiments shown in FIGS. 5 to 9, a wide metal wiring if connected via an insulating film to the semiconductor layer or another metal wiring. Therefore, the wide metal wiring is fixedly supported. Furthermore, the metal wiring curves because of such connection, thereby dispersing stresses in directions different from the lateral direction. In this manner, metal wirings are prevented from slides. In addition, manufacturing processes are not required to be changed.

I claim:

1. A semiconductor device having at least one transistor including a gate electrode comprising a first material, comprising:

(a) a semiconductor substrate on which the device is provided;

(b) a first conductive layer having a plurality of conductive lines provided in spaced parallel relationship above a peripheral region of the semiconductor substrate, each of the plurality of conductive lines including the first material, the plurality of conductive lines extending lengthwise in parallel along a first direction;

(c) an insulating layer formed over the first conductive layer, the insulating layer having a corrugated surface caused by the plurality of conductive lines; and (d) a second conductive layer formed on the insulating layer, the second conductive layer having a corrugated surface transferred from the insulating layer, the second conductive layer having a length greater than a width, the length of the second conductive layer extending along the first direction above the plurality of conductive lines of the first conductive layer.

2. A semiconductor device according to claim 1, further comprising:

(e) a passivation layer formed on the second conductive layer.

3. A semiconductor device according to claim 1, further comprising a plurality of holes formed through the insulating layer to make contacts between the first conductive layer and the second conductive layer.

4. A semiconductor device according to claim 3, wherein the contacts are disposed at a predetermined pitch along a longitudinal direction of the plurality of conductive lines.

5. A semiconductor device according to claim 1, wherein the first conductive layer is formed at a corner of the substrate.

6. A semiconductor device according to claim 1, wherein the insulating layer comprises $SiO_2$.

7. A semiconductor device according to claim 1, wherein the first material is selected from a group consisting of polysilicon, polycide and silicide.

8. A semiconductor device according to claim 1, wherein the second conductive layer comprises a material selected from a group consisting of aluminum, aluminum alloy, copper and copper alloy.

9. A semiconductor device according to claim 1, wherein a width of the second conductive layer extends over two or more of the plurality of conductive lines.

10. A semiconductor device having at least one transistor including a gate electrode comprising a first material, comprising:
   (a) a semiconductor substrate on which the device is provided;
   (b) a first conductive layer having a plurality of conductive lines provided in spaced parallel relationship and extending lengthwise along a first direction above a peripheral region of the semiconductor, each of the plurality of conductive lines having an L-shape and including the first material;
   (c) an insulating layer formed over the first conductive layer, the insulating layer having a corrugated surface caused by the plurality of conductive lines; and
   (d) a second conductive layer formed on the insulating layer, the second conductive layer having a corrugated surface transferred from the insulating layer, wherein widths of each of the plurality of conductive lines are narrower than a width of the second conductive layer, a length of the second conductive layer extending along the first direction above the plurality of conductive lines of the first conductive layer.

11. A semiconductor device according to claim 10, further comprising a plurality of holes formed through the insulating layer to make contacts between the first conductive layer and the second conductive layer.

12. A semiconductor device according to claim 11, wherein the contacts are disposed at a predetermined pitch along a longitudinal direction of the plurality of conductive lines.

13. A semiconductor device according to claim 10, wherein the first conductive layer is formed at a corner of the substrate.

14. A semiconductor device according to claim 10, wherein the insulating layer comprises $SiO_2$.

15. A semiconductor device according to claim 10, wherein the first material is selected from a group consisting of polysilicon, polycide and silicide.

16. A semiconductor device according to claim 10, wherein the second conductive layer comprises a material selected from a group consisting of aluminum, aluminum alloy, copper and copper alloy.

17. A semiconductor device according to claim 10, wherein the second conductive layer is a power source line or a ground line.

18. A semiconductor device according to claim 10, wherein a width of the second conductive layer extends over two or more of the plurality of conductive lines.

* * * * *